(12) United States Patent
Lee et al.

(10) Patent No.: US 6,221,716 B1
(45) Date of Patent: Apr. 24, 2001

(54) METHOD OF MANUFACTURING A FLASH MEMORY DEVICE

(75) Inventors: Young Chun Lee; Jin Shin; Sang Soo Kim, all of Kyungki-Do (KR)

(73) Assignee: Hyundai Electronics Industries Co., Ltd., Kyungki-Do (KR)

( * ) Notice: Subject to any disclaimer, the term of this patent is extended or adjusted under 35 U.S.C. 154(b) by 0 days.

(21) Appl. No.: 09/428,424

(22) Filed: Oct. 27, 1999

(30) Foreign Application Priority Data

Oct. 27, 1998 (KR) .................................................. 98-45177

(51) Int. Cl.⁷ .................................................. H01L 21/336
(52) U.S. Cl. ............................................ 438/257; 438/258
(58) Field of Search ...................................... 438/257, 258, 438/264

(56) References Cited

U.S. PATENT DOCUMENTS

| 5,535,158 | 7/1996 | Yamagata ..................... 365/185.29 |
| 5,543,637 | 8/1996 | Baliga .................................. 257/77 |
| 5,587,947 | 12/1996 | Chang et al. ...................... 365/185.3 |
| 5,687,120 | 11/1997 | Chang et al. ...................... 365/185.3 |
| 5,689,459 | 11/1997 | Chang et al. .................... 365/185.28 |
| 5,863,822 | 1/1999 | Kanamori et al. ................... 438/264 |
| 5,877,524 | 3/1999 | Oonakado et al. .................. 257/321 |
| 6,117,733 * | 9/2000 | Sung et al. .......................... 438/265 |
| 6,121,072 * | 9/2000 | Choi et al. ........................... 438/129 |

FOREIGN PATENT DOCUMENTS

| 6-151780 | 5/1994 | (JP) . |
| 7-130886 | 5/1995 | (JP) . |
| 8-250610 | 9/1996 | (JP) . |
| 10-22480 | 1/1998 | (JP) . |

* cited by examiner

*Primary Examiner*—John F. Niebling
*Assistant Examiner*—Stacy Whitmore
(74) *Attorney, Agent, or Firm*—Pennie & Edmonds LLP

(57) ABSTRACT

There is disclosed a method of manufacturing a flash memory cell comprising the steps of forming a first ploysilicon layer pattern then forms a cell source; patterning a second polysilicon layer so that a gate electrode can be formed while the portion of the first polysilicon pattern where the cell drain will be formed is opened; forming a transistor at peripheral circuit area by performing ion injection process and a thermal process; forming a floating gate and a control gate by performing a self aligned etching process; and forming a cell source line and a cell drain by injecting cell source/drain ions. The flash memory cell formed thus has an increased coupling ratio since the control gate is formed to surround the floating gate, and also has an improved hot carrier reliability characteristic both at the peripheral circuit and the cell area upon operation of the device since the cell drain is formed after the thermal process for forming the peripheral circuit source and drain.

2 Claims, 3 Drawing Sheets

METHOD OF MANUFACTURING A FLASH MEMORY DEVICE

FIELD OF THE INVENTION

1. Field of the Invention

The present invention relates to a method of manufacturing a flash memory device. In particular, the present invention relates to a method of manufacturing a flash memory device capable of increasing the coupling ratio and also of improving reliability of hot carriers both at the peripheral circuit area and the cell area upon operation of the device, by which a control gate is formed to surround one side of a floating gate and the source/drain junction of the peripheral circuit area is formed before formation of the drain junction of the memory cell area.

2. Description of the Prior Art

Generally, as degree of integration of the memory device is increased and the operating voltage is lowered, the current flash memory device requires a cell having a higher program operating speed and erase operating speed. In order for the cell have a higher program operating speed and erase operating speed, it is believed that the coupling ration of the cell has to be increased. With the convention cell structure, however, there is a limitation to increase the coupling ratio.

FIG. 1A shows a layout of a conventional flash memory device, and FIG. 1B shows a sectional view of a conventional flash memory device.

Now, the method of manufacturing the conventional flash memory device will be explained by reference to FIGS. 1A and 1B.

A field oxide film 20 is formed on a semiconductor substrate 10 to define active regions at the cell area and the peripheral circuit area. Then, a tunneling oxide film 31 is formed on the active region of the cell area. Next, a first polysilicon layer is formed on the entire structure including the tunneling oxide film 31. Thereafter, the first polysilicon layer is patterned by etching process using a floating gate mask. After a -cell source 35 is formed by injecting the cell source ions, a dielectric film 33 is formed on the entire structure. Then, after a second polysilicon layer is formed on the entire structure including the dielectric film 33, the second ploysilicon layer, the dielectric film 33 and the first polysilicon layer are sequentially etched by etching process using the control gate mask, thus forming a floating gate 32 and a control gate 34 at the cell area. During these processes, a gate electrode (not shown) is formed at the active region of the peripheral circuit area. A source line 35A and a cell drain 36 is formed at the cell area by performing a self aligned source etching process and injecting cell source/drain ions. Then, a LDD (Lightly Doped Drain) ion injection process, a spacer forming process, a peripheral circuit source/drain ions injection process and a thermal process are sequentially performed to form a transistor of a LDD structure. An inter-insulating film (not shown) is formed on the entire structure. A drain contact 37 is formed at the cell drain 36 by performing a contact process.

Meanwhile, as the programming of the flash memory cell is operated by injecting hot carriers in view of cell characteristic, the cell drain 36 where the hot carriers are occurring has an abrupt structure. So as to keep this structure, it is believed that the thermal process has to be performed after the cell source/drain ion injection process. However, according to the above-mentioned conventional method, the thermal process is performed after the cell source/drain ion injection process. At this time, if the thermal process is not performed after the peripheral circuit source/drain ion injection process to improve the cell characteristic, the junction of the peripheral circuit becomes an abrupt structure, thus the hot carrier reliability characteristic is deteriorated in view of transistor characteristic. In other words, in case that the flash memory is manufactured by the conventional method, there is a problem that the hot carrier reliability characteristic both of the cell area and the peripheral circuit area could not be satisfied.

SUMMARY OF THE INVENTION

Therefore, it is an object of the present invention to solve the problems involved in the prior art, and to provide a method of manufacturing a flash memory device capable of increasing the coupling ratio and also of improving reliability of hot carriers both at the peripheral circuit area and the cell area upon operation of the device, by which a control gate is formed to surround one side of a floating gate and the source/drain junction of the peripheral circuit area is formed before formation of the drain junction of the memory cell area.

To achieve the above object, the method of manufacturing a flash memory cell device is characterized in that it comprises the steps of forming a tunneling oxide film and a first ploysilicon layer on a semiconductor substrate and then patterning the first polysilicon layer by etching process using a floating gate as a mask; forming a cell source at an active region of a cell area through cell source ion injection; forming a dielectric film and a second polysilicon layer, and then pattering the second polysilicon layer while opening a portion of the first polysilicon layer pattern so that a gate electrode can be formed at a peripheral circuit area; performing sequentially a LDD ion injection process, a spacer forming process, a peripheral circuit source/drain ion injection process and a thermal process for activating ions to form a transistor of a LDD structure, wherein during the process of forming the spacer, a spacer is formed even at the side of the second polysilicon pattern on the cell area; etching the first and second polysilicon layer patterns at the cell area to form a floating gate and a control gate surrounding one side of the control gate through a self aligned etching process using the control gate and the spacer as masks; and forming a cell source line and a cell drain using the cell source self aligned etching process and the cell source/drain ion injection process.

BRIEF DESCRIPTION OF THE DRAWINGS

The above object, and other features and advantages of the present invention will become more apparent by describing the preferred embodiment thereof with reference to the accompanying drawings, in which.

DETAILED DESCRIPTION OF THE INVENTION

One embodiment of the present invention will be below explained in detail by reference to the accompanying drawings.

Figure 1A:
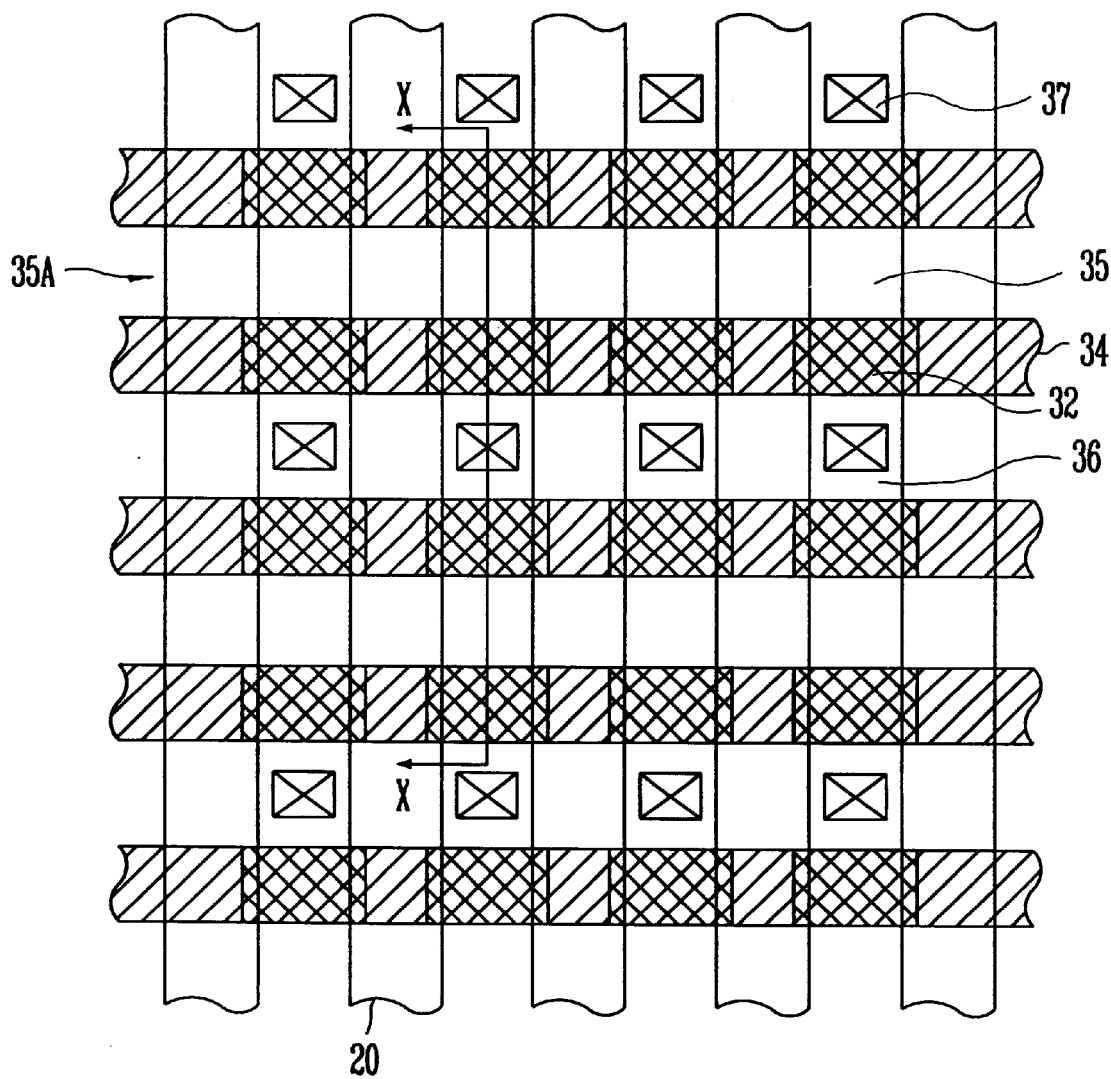
FIG. 1A shows a layout of a conventional flash memory device.
Figure 1B:
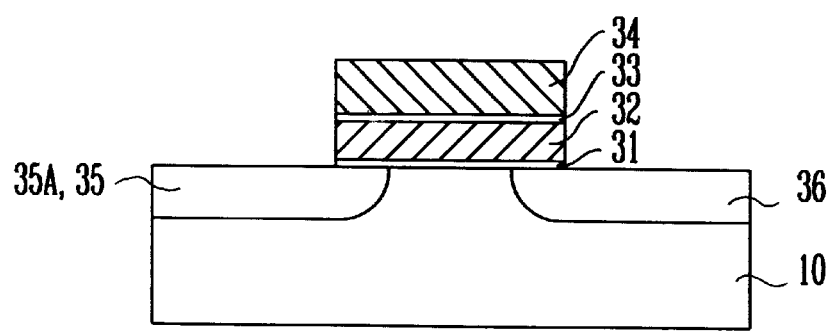
FIG. 1B shows a sectional view of a conventional flash memory device.
Figure 2:
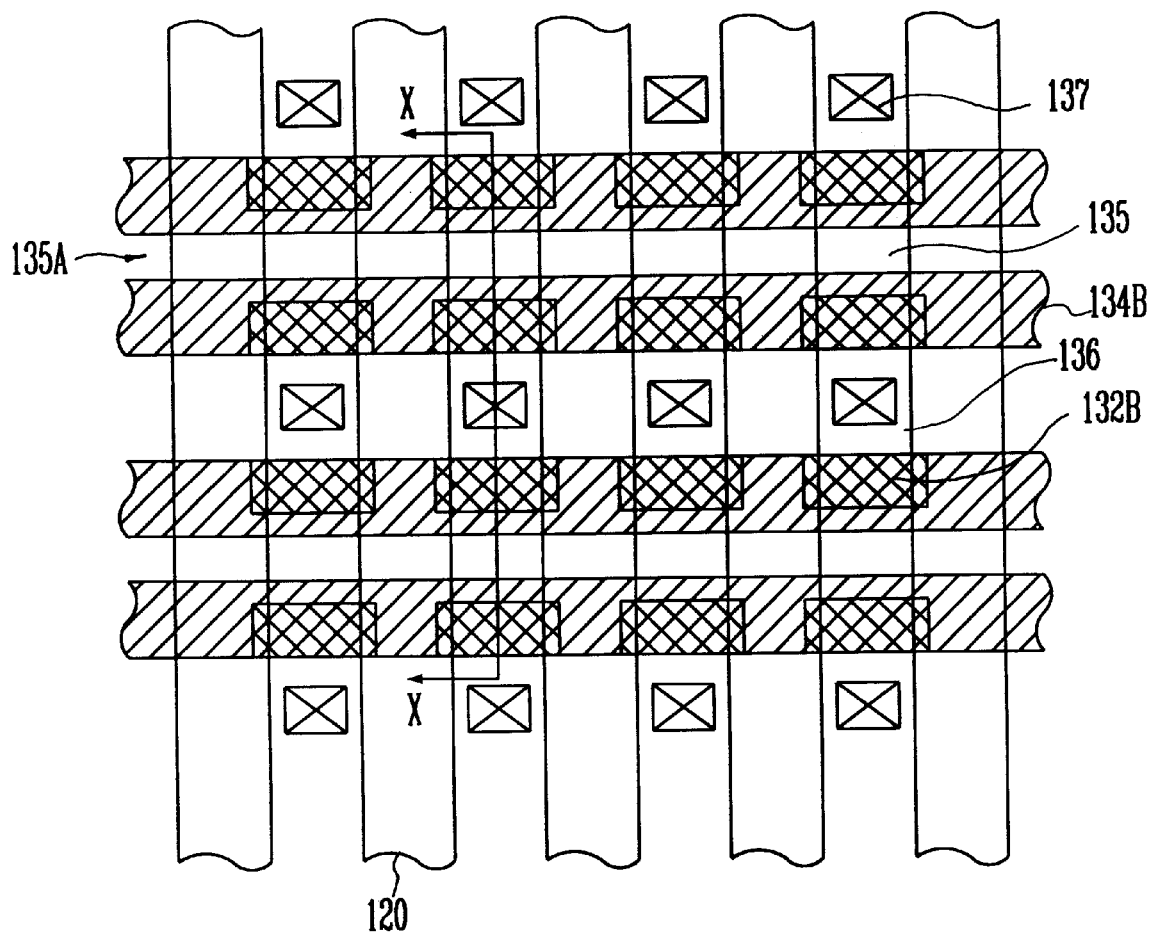
FIG. 2 shows a layout of a flash memory device according to one embodiment of the present invention.

FIG. 2 shows a layout of a flash memory device according to one embodiment of the present invention, and FIGS. 3A to 3E show sectional views for illustrating a method of manufacturing a flash memory device taken along lines X—X according to one embodiment of the present invention.

Figure 3A:
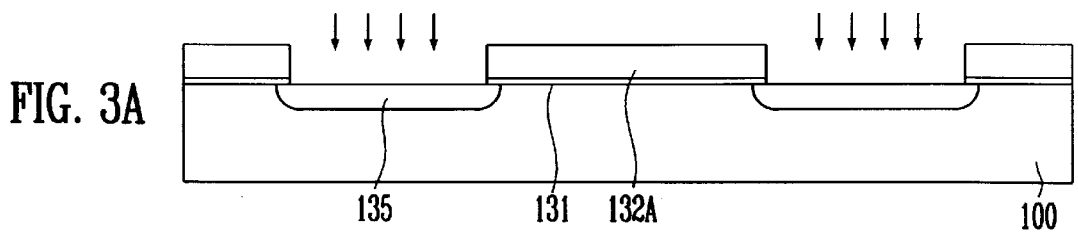
FIGS. 3A to 3E show sectional views for illustrating a method of manufacturing a flash memory device according to one embodiment of the present invention.

Referring to FIGS. 2 and 3A, a field oxide film 120 is formed on a semiconductor substrate 100 to define active regions at the cell area and the peripheral circuit area. After a tunnel oxide film 131 and a first ploysilicon layer are sequentially deposited, the first polysilicon layer is patterned by etching process using the floating gate mask to form a first polysilicon layer pattern 132A. Then, a cell source 135 is formed at the active region of the cell area by performing a cell source ion injection process.

Figure 3B:
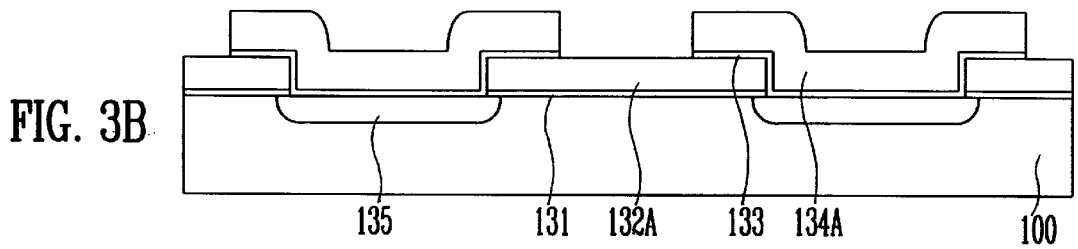

Referring to FIGS. 2 and 3B, a dielectric film 133 and a second polysilicon layer are sequentially formed on the entire in which the first polysilicon layer pattern 132A. Then, a second polysilicon layer pattern 134A is formed so that a gate electrode (not shown) is formed at the peripheral circuit area while a portion of the first polysilicon layer pattern 132A at the position where the cell drain will be formed is opened. After formation the second polysilicon layer pattern 134A at the cell area, LDD ion injection process is performed at the peripheral circuit area.

In the above, while the LDD ion injection process is performed, as the first and second polysilicon pattern 132A and 134A serve as barrier in the cell area it does not affect by the LDD ion injection process.

Figure 3C:
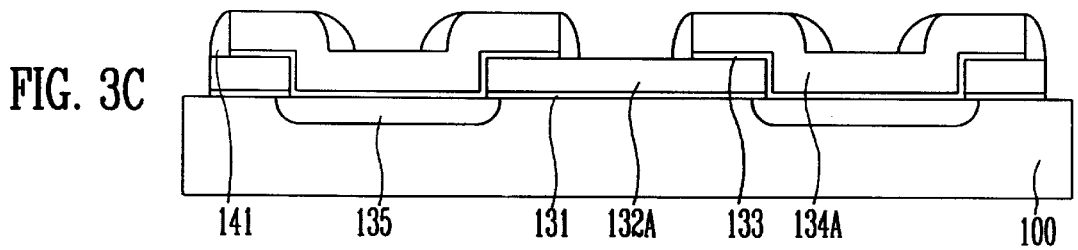

Referring to FIGS. 2 and 3C, a space forming process, a peripheral circuit source/drain ion injection process and a thermal process for activating injected ions are sequentially performed to formed a transistor of LDD structure at the active region of the peripheral circuit area. At this time, during the space forming process, a spacer 141 is formed at side wall of the second polysilicon pattern 134A.

In the above, as the thermal process is performed after the peripheral circuit source/drain ion injection process, the transistor characteristic of the peripheral circuit can be improved.

Figure 3D:
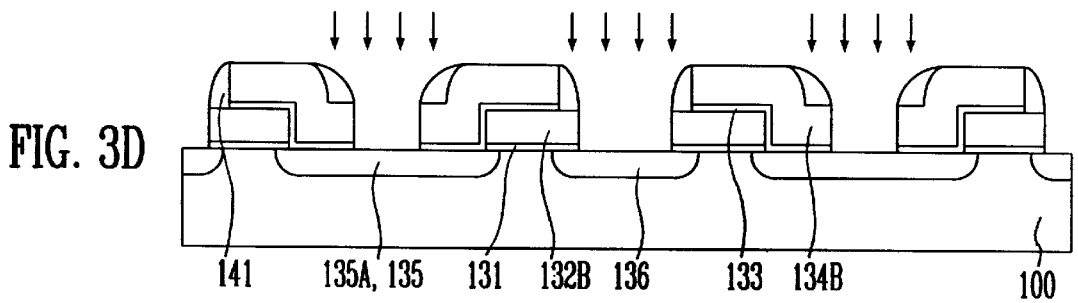

Referring to FIGS. 2 and 3D, with a self aligned etching process using the spacer 141 as a sidewall barrier while using the control gate mask at the cell area, the second polysilicon layer pattern 134A, the dielectric film 133, the first ploysilicon layer pattern 132A and the tunneling oxide film 131 are etched. Thereby, a floating gate 132B and a control gate 134B surrounding one side of the floating gate 132B are formed. An exposed portion of field oxide film 120 around the cell source 135 is removed by a cell source self aligned etching process. Then, a cell source line 135A and a cell drain 136 are formed by performing the cell source/drain ion injection process.

In the above, the cell drain 136 is not performed after the cell source/drain ion injection process, and thus has an abrupt structure. The control gate 134B can be formed as a metal silicide layer so that its electrical resistance can be reduced.

Figure 3E:
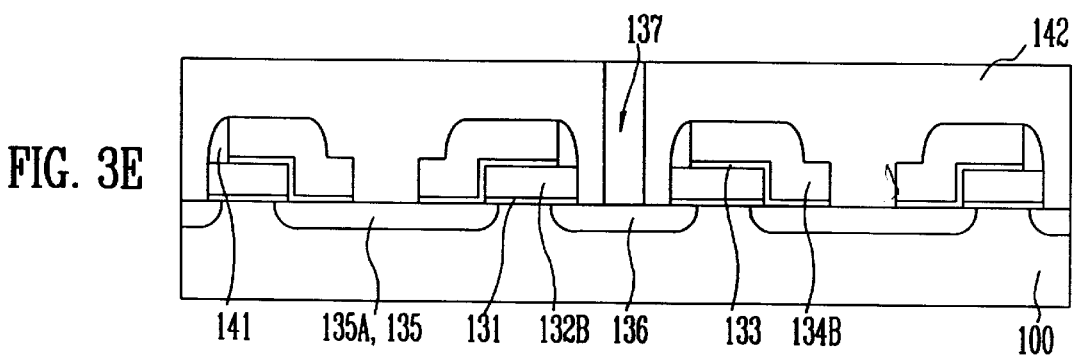

Finally, referring now to FIGS. 2 and 3E, an interlayer insulating film 142 is formed on the entire structure. Then, with contact etching process, the interlayer insulating film 142 is etched to form a drain contact 137 at the drain 136.

As described above, according to the present invention, the following effects can be obtained.

First, compared to the conventional flash memory cell, as the coupling ration can be increased due to the increased effective surface area as much as the area of the floating gate sidewall, the present invention can manufacture a device having a higher degree of integration at a low voltage.

Second, as the source/drain junction is formed before formation of the drain junction of the memory cell, the present invention can obtain a peripheral circuit transistor having a good hot carrier characteristic since a thermal process can be performed upon forming the junction of the peripheral circuit. Also, as thermal process is not performed after forming the drain junction of the cell, the present invention can increase the hot carrier reliability upon operation of the cell since the cell junction having an abrupt structure can be formed.

Third, as the present invention uses a spacer as a barrier during the self aligned etching process, it can make larger design rule of the cell since it can form a wider word line.

While the present invention has been described and illustrated herein with reference to the preferred embodiment thereof, it will be understood by those skilled in the art that various changes in form and details may be made therein without departing from the spirit and scope of the invention.

What is claimed is:

1. A method of manufacturing a flash memory cell device, comprising the steps of:

forming a tunneling oxide film and a first ploysilicon layer on a semiconductor substrate and then patterning said first polysilicon layer by etching process using a floating gate mask;

forming a cell source at a cell area by performing a cell source ion injection process;

forming sequentially a dielectric film and a second polysilicon layer, and then pattering said second polysilicon layer while opening a portion of said first polysilicon layer pattern so that a gate electrode can be formed at a peripheral circuit area;

performing sequentially a LDD ion injection process, a spacer forming process, a peripheral circuit source/drain ion injection process and a thermal process for activating injected ions to form a transistor of a LDD structure, wherein during the process of forming the spacer, a spacer is formed even at the sidewall of said second polysilicon pattern on the cell area;

etching the first and second polysilicon layer patterns at the cell area by performing a self aligned etching process using the control gate mask and said spacer, thereby forming a floating gate and a control gate surrounding one side of said floating gate; and forming a cell source line and a cell drain by performing a cell source self aligned etching process and a cell source/drain ion injection process.

2. The method of manufacturing the flash memory cell as claimed in claim 1, wherein the cell drain is formed to be an abrupt structure.

* * * * *